(12) United States Patent
Sommer et al.

(10) Patent No.: US 7,697,326 B2
(45) Date of Patent: Apr. 13, 2010

(54) REDUCING PROGRAMMING ERROR IN MEMORY DEVICES

(75) Inventors: Naftali Sommer, Rishon Le Zion (IL); Ofir Shalvi, Ra'anana (IL)

(73) Assignee: Anobit Technologies Ltd., Herzilia Pituach (IL)

( * ) Notice: Subject to any disclaimer, the term of this patent is extended or adjusted under 35 U.S.C. 154(b) by 0 days.

(21) Appl. No.: 11/995,806

(22) PCT Filed: May 10, 2007

(86) PCT No.: PCT/IL2007/000575

§ 371 (c)(1),
(2), (4) Date: Jan. 15, 2008

(87) PCT Pub. No.: WO2007/132452

PCT Pub. Date: Nov. 22, 2007

(65) Prior Publication Data

US 2009/0103358 A1 Apr. 23, 2009

Related U.S. Application Data

(60) Provisional application No. 60/747,106, filed on May 12, 2006, provisional application No. 60/821,764, filed on Aug. 8, 2006, provisional application No. 60/863,810, filed on Nov. 1, 2006.

(51) Int. Cl.
*G11C 16/04* (2006.01)

(52) U.S. Cl. ............... 365/185.03; 365/189.15; 365/189.16; 365/185.22

(58) Field of Classification Search ............ 365/185.03, 365/189.011, 189.14–189.16, 185.22
See application file for complete search history.

(56) References Cited

U.S. PATENT DOCUMENTS 4,556,961 A 12/1985 Iwahashi et al.

(Continued)

FOREIGN PATENT DOCUMENTS

EP 0783754 B1 7/1997

(Continued)

OTHER PUBLICATIONS

U.S. Appl. No. 11/949,135 Official Action dated Oct. 2, 2009.

(Continued)

*Primary Examiner*—David Lam
(74) *Attorney, Agent, or Firm*—Darby & Darby P.C.

(57) ABSTRACT

A method for storing data in an array (28) of analog memory cells (32) includes defining a constellation of voltage levels (90A, 90B, 90C, 90D) to be used in storing the data. A part of the data is written to a first analog memory cell in the array by applying to the analog memory cell a first voltage level selected from the constellation. After writing the part of the data to the first analog memory cell, a second voltage level that does not belong to the constellation is read from the first analog memory cell. A modification to be made in writing to one or more of the analog memory cells in the array is determined responsively to the second voltage level, and data are written to the one or more of the analog memory cells subject to the modification.

38 Claims, 5 Drawing Sheets

U.S. PATENT DOCUMENTS

| | | | |
|---|---|---|---|
| 4,558,431 | A | 12/1985 | Satoh |
| 4,661,929 | A | 4/1987 | Aoki et al. |
| 4,768,171 | A | 8/1988 | Tada |
| 4,811,285 | A | 3/1989 | Walker et al. |
| 4,899,342 | A | 2/1990 | Potter et al. |
| 4,910,706 | A | 3/1990 | Hyatt |
| 4,993,029 | A | 2/1991 | Galbraith et al. |
| 5,056,089 | A | 10/1991 | Furuta et al. |
| 5,172,338 | A | 12/1992 | Mehrotta et al. |
| 5,191,584 | A | 3/1993 | Anderson |
| 5,200,959 | A | 4/1993 | Gross et al. |
| 5,237,535 | A | 8/1993 | Mielke et al. |
| 5,272,669 | A | 12/1993 | Samachisa et al. |
| 5,388,064 | A | 2/1995 | Khan |
| 5,416,782 | A | 5/1995 | Wells et al. |
| 5,473,753 | A | 12/1995 | Wells et al. |
| 5,479,170 | A | 12/1995 | Cauwenberghs et al. |
| 5,508,958 | A | 4/1996 | Fazio et al. |
| 5,519,831 | A | 5/1996 | Holzhammer |
| 5,541,886 | A | 7/1996 | Hasbun |
| 5,600,677 | A | 2/1997 | Citta et al. |
| 5,657,332 | A | 8/1997 | Auclair et al. |
| 5,675,540 | A | 10/1997 | Roohparvar |
| 5,696,717 | A | 12/1997 | Koh |
| 5,726,649 | A | 3/1998 | Tamaru et al. |
| 5,742,752 | A | 4/1998 | De Koning |
| 5,751,637 | A | 5/1998 | Chen et al. |
| 5,761,402 | A | 6/1998 | Kaneda et al. |
| 5,801,985 | A | 9/1998 | Roohparvar et al. |
| 5,838,832 | A | 11/1998 | Barnsley |
| 5,860,106 | A | 1/1999 | Domen et al. |
| 5,867,429 | A | 2/1999 | Chen et al. |
| 5,877,986 | A | 3/1999 | Harari et al. |
| 5,901,089 | A | 5/1999 | Korsh et al. |
| 5,909,449 | A | 6/1999 | So et al. |
| 5,912,906 | A | 6/1999 | Wu et al. |
| 5,930,167 | A | 7/1999 | Lee et al. |
| 5,942,004 | A | 8/1999 | Cappelletti |
| 5,991,517 | A | 11/1999 | Harari et al. |
| 6,009,014 | A | 12/1999 | Hollmer et al. |
| 6,034,891 | A | 3/2000 | Norman |
| 6,040,993 | A | 3/2000 | Chen et al. |
| 6,041,430 | A | 3/2000 | Yamauchi |
| 6,073,204 | A | 6/2000 | Lakhani et al. |
| 6,101,614 | A | 8/2000 | Gonzales et al. |
| 6,128,237 | A | 10/2000 | Shirley et al. |
| 6,134,140 | A | 10/2000 | Tanaka et al. |
| 6,134,143 | A | 10/2000 | Norman |
| 6,134,631 | A | 10/2000 | Jennings |
| 6,141,261 | A | 10/2000 | Patti |
| 6,166,962 | A | 12/2000 | Chen et al. |
| 6,185,134 | B1 | 2/2001 | Tanaka et al. |
| 6,209,113 | B1 | 3/2001 | Roohparvar |
| 6,212,654 | B1 | 4/2001 | Lou et al. |
| 6,219,276 | B1 | 4/2001 | Parker |
| 6,219,447 | B1 | 4/2001 | Lee et al. |
| 6,222,762 | B1 | 4/2001 | Guterman et al. |
| 6,230,233 | B1 | 5/2001 | Lofgren et al. |
| 6,275,419 | B1 | 8/2001 | Guterman et al. |
| 6,279,069 | B1 | 8/2001 | Robinson et al. |
| 6,288,944 | B1 | 9/2001 | Kawamura |
| 6,292,394 | B1 | 9/2001 | Cohen et al. |
| 6,301,151 | B1 | 10/2001 | Engh et al. |
| 6,304,486 | B1 | 10/2001 | Yano |
| 6,307,776 | B1 | 10/2001 | So et al. |
| 6,317,363 | B1 | 11/2001 | Guterman et al. |
| 6,317,364 | B1 | 11/2001 | Guterman et al. |
| 6,363,008 | B1 | 3/2002 | Wong |
| 6,363,454 | B1 | 3/2002 | Lakhani et al. |
| 6,396,742 | B1 | 5/2002 | Korsh et al. |
| 6,397,364 | B1 | 5/2002 | Barkan |
| 6,405,323 | B1 | 6/2002 | Lin et al. |
| 6,442,585 | B1 | 8/2002 | Dean et al. |
| 6,456,528 | B1 | 9/2002 | Chen |
| 6,466,476 | B1 | 10/2002 | Wong et al. |
| 6,467,062 | B1 | 10/2002 | Barkan |
| 6,469,931 | B1 | 10/2002 | Ban et al. |
| 6,522,580 | B2 | 2/2003 | Chen et al. |
| 6,525,952 | B2 | 2/2003 | Araki et al. |
| 6,532,556 | B1 | 3/2003 | Wong et al. |
| 6,538,922 | B1 | 3/2003 | Khalid et al. |
| 6,558,967 | B1 | 5/2003 | Wong |
| 6,560,152 | B1 | 5/2003 | Cernea |
| 6,577,539 | B2 | 6/2003 | Iwahashi |
| 6,584,012 | B2 | 6/2003 | Banks |
| 6,615,307 | B1 | 9/2003 | Roohparvar |
| 6,621,739 | B2 | 9/2003 | Gonzalez et al. |
| 6,643,169 | B2 | 11/2003 | Rudelic et al. |
| 6,678,192 | B2 | 1/2004 | Gongwer et al. |
| 6,687,155 | B2 * | 2/2004 | Nagasue ................ 365/185.03 |
| 6,707,748 | B2 | 3/2004 | Lin et al. |
| 6,708,257 | B2 | 3/2004 | Bao |
| 6,717,847 | B2 | 4/2004 | Chen |
| 6,731,557 | B2 | 5/2004 | Beretta |
| 6,738,293 | B1 | 5/2004 | Iwahashi |
| 6,751,766 | B2 | 6/2004 | Guterman et al. |
| 6,757,193 | B2 | 6/2004 | Chen et al. |
| 6,781,877 | B2 | 8/2004 | Cernea et al. |
| 6,807,095 | B2 | 10/2004 | Chen et al. |
| 6,829,167 | B2 | 12/2004 | Tu et al. |
| 6,845,052 | B1 | 1/2005 | Ho et al. |
| 6,851,018 | B2 | 2/2005 | Wyatt et al. |
| 6,856,546 | B2 | 2/2005 | Guterman et al. |
| 6,862,218 | B2 | 3/2005 | Guterman et al. |
| 6,870,767 | B2 | 3/2005 | Rudelic et al. |
| 6,894,926 | B2 | 5/2005 | Guterman et al. |
| 6,907,497 | B2 | 6/2005 | Hosono et al. |
| 6,963,505 | B2 | 11/2005 | Cohen |
| 6,972,993 | B2 | 12/2005 | Conley et al. |
| 6,988,175 | B2 | 1/2006 | Lasser |
| 6,992,932 | B2 | 1/2006 | Cohen |
| 7,002,843 | B2 | 2/2006 | Guterman et al. |
| 7,012,835 | B2 | 3/2006 | Gonzalez et al. |
| 7,020,017 | B2 | 3/2006 | Chen et al. |
| 7,023,735 | B2 | 4/2006 | Ban et al. |
| 7,031,210 | B2 | 4/2006 | Park et al. |
| 7,031,214 | B2 | 4/2006 | Tran |
| 7,031,216 | B2 | 4/2006 | You |
| 7,054,193 | B1 | 5/2006 | Wong |
| 7,057,958 | B2 | 6/2006 | So et al. |
| 7,065,147 | B2 | 6/2006 | Ophir et al. |
| 7,068,539 | B2 | 6/2006 | Guterman et al. |
| 7,079,555 | B2 | 7/2006 | Baydar et al. |
| 7,088,615 | B2 | 8/2006 | Guterman et al. |
| 7,099,194 | B2 | 8/2006 | Tu et al. |
| 7,102,924 | B2 | 9/2006 | Chen et al. |
| 7,113,432 | B2 | 9/2006 | Mokhlesi |
| 7,130,210 | B2 | 10/2006 | Bathul et al. |
| 7,139,192 | B1 | 11/2006 | Wong |
| 7,139,198 | B2 | 11/2006 | Guterman et al. |
| 7,170,802 | B2 | 1/2007 | Cernea et al. |
| 7,173,859 | B2 | 2/2007 | Hemink |
| 7,177,184 | B2 | 2/2007 | Chen |
| 7,177,195 | B2 | 2/2007 | Gonzales et al. |
| 7,177,199 | B2 | 2/2007 | Chen et al. |
| 7,177,200 | B2 | 2/2007 | Ronen et al. |
| 7,187,195 | B2 | 3/2007 | Kim |
| 7,187,592 | B2 | 3/2007 | Guterman et al. |
| 7,193,898 | B2 | 3/2007 | Cernea |
| 7,193,921 | B2 | 3/2007 | Choi et al. |
| 7,196,928 | B2 | 3/2007 | Chen |
| 7,197,594 | B2 | 3/2007 | Raz et al. |
| 7,200,062 | B2 | 4/2007 | Kinsely et al. |
| 7,221,592 | B2 | 5/2007 | Nazarian |

| | | |
|---|---|---|
| 7,224,613 B2 | 5/2007 | Chen et al. |
| 7,231,474 B1 | 6/2007 | Helms et al. |
| 7,243,275 B2 | 7/2007 | Gongwer et al. |
| 7,254,690 B2 | 8/2007 | Rao |
| 7,257,027 B2 | 8/2007 | Park |
| 7,259,987 B2 | 8/2007 | Chen et al. |
| 7,266,026 B2 | 9/2007 | Gongwer et al. |
| 7,274,611 B2 | 9/2007 | Roohparvar |
| 7,277,355 B2 | 10/2007 | Tanzawa |
| 7,280,398 B1 | 10/2007 | Lee at al. |
| 7,289,344 B2 | 10/2007 | Chen |
| 7,301,807 B2 | 11/2007 | Khalid et al. |
| 7,308,525 B2 | 12/2007 | Lasser et al. |
| 7,310,255 B2 | 12/2007 | Chan |
| 7,310,272 B1 | 12/2007 | Mokhlesi et al. |
| 7,321,509 B2 | 1/2008 | Chen et al. |
| 7,342,831 B2 | 3/2008 | Mokhlesi et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,397,697 B2 | 7/2008 | So et al. |
| 7,408,804 B2 | 8/2008 | Hemink et al. |
| 7,409,473 B2 | 8/2008 | Conley et al. |
| 7,420,847 B2 | 9/2008 | Li |
| 7,433,231 B2 | 10/2008 | Aritome |
| 7,437,498 B2 | 10/2008 | Ronen |
| 7,441,067 B2 | 10/2008 | Gorobetz et al. |
| 7,453,737 B2 | 11/2008 | Ha |
| 7,468,911 B2 | 12/2008 | Lutze et al. |
| 7,471,581 B2 | 12/2008 | Tran et al. |
| 7,508,710 B2 | 3/2009 | Mokhlesi |
| 7,570,520 B2 | 8/2009 | Kamei et al. |
| 7,593,259 B2 | 9/2009 | Kim |
| 2001/0006479 A1 | 7/2001 | Ikehashi et al. |
| 2002/0118574 A1 | 8/2002 | Gongwer et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0086574 A1 | 4/2005 | Fackenthal |
| 2005/0121436 A1 | 6/2005 | Kamitani et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0203546 A1 | 9/2006 | Lasser |
| 2006/0218359 A1 | 9/2006 | Sanders et al. |
| 2006/0221705 A1 | 10/2006 | Hemink et al. |
| 2006/0239077 A1 | 10/2006 | Park et al. |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0104309 A1 | 5/2008 | Cheon et al. |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239812 A1 | 10/2008 | Abiko et al. |
| 2008/0263262 A1 | 10/2008 | Sokolov et al. |
| 2008/0282106 A1 | 11/2008 | Shalvi et al. |
| 2009/0024905 A1 | 1/2009 | Shalvi et al. |
| 2009/0043831 A1 | 2/2009 | Antonopoulos et al. |
| 2009/0043951 A1 | 2/2009 | Shalvi et al. |

| | | | |
|---|---|---|---|
| 2009/0049234 A1 | 2/2009 | Oh et al. | |
| 2009/0089484 A1 | 4/2009 | Chu | |
| 2009/0091979 A1 | 4/2009 | Shalvi | |
| 2009/0106485 A1 | 4/2009 | Anholt | |
| 2009/0144600 A1 | 6/2009 | Perlmutter et al. | |
| 2009/0172257 A1 | 7/2009 | Prins et al. | |
| 2009/0172261 A1 | 7/2009 | Prins et al. | |
| 2009/0204824 A1 | 8/2009 | Lin et al. | |
| 2009/0225595 A1 | 9/2009 | Kim | |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007/146010 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009050703 A2 | 4/2009 |

OTHER PUBLICATIONS

Agrell et al., "Closest Point Search in Lattices", IEEE Transactions on Information Theory, vol. 48, No. 8, pp. 2201-2214, Aug. 2002.

Blahut, R.E., "Theory and Practice of Error Control Codes," Addison-Wesley, May, 1984, section 3.2, pp. 47-48.

Chang, L., "Hybrid Solid State Disks: Combining Heterogeneous NAND Flash in Large SSDs", ASPDAC, Jan., 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Kawaguchi et al. 1995. A flash-memory based file system. In Proceedings of the USENIX 1995 Technical Conference , New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

ONFI, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May, 2004.

ST Microelectronics, "Wear Leveling in Single Level Cell NAND Flash Memories," Application note AN-1822 Geneva, Switzerland, Feb. 2007.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan 28, 2009.

International Application PCT/IL2008/001356 Search Report dated Feb 3, 2009.

International Application PCT/IL2008/001446 Search report dated Feb 20, 2009.

International Application PCT/IL2008/001446 "Optimized selection of memory chips in multi-chip memory devices" filed on Nov. 4, 2008.

Perlmutter et al, U.S. Appl. No. 12/332,368 "Efficient Interference Cancellation in Analog Memory Cell Arrays" filed on Dec. 11, 2008.

Kasorla et al, U.S. Appl. No. 12/332,370 "Efficient Data Storage in Multi-Plane Memory Devices" filed on Dec. 11, 2008.

Sommer, N., U.S. Appl. No. 12/364,531 "Parameter Estimation Based on Error Correction Code Parity Check Equations" filed on Feb. 3, 2009.

Golov et al., U.S. Appl. No. 12/344,233 "Wear Level Estimation in Analog Memory Cells" filed on Dec. 25, 2008.

Perlmutter et al., U.S. Appl. No. 12/388,528 "Programming of Analog Memory Cells Using a Single Programming Pulse per State Transition" filed on Feb. 19, 2009.

Perlmutter et al., U.S. Appl. No. 12/390,522 "Programming Analog Memory Cells for Reduced Variance After Retention" filed on Feb. 23, 2009.

Perlmutter et al., U.S. Appl. No. 12/405,275 "Memory Device with Multiple-Accuracy Read Commands" filed on Mar. 17, 2009.

Perlmutter et al., U.S. Appl. No. 12/397,368 "Efficient Readout from Analog Memory Cells Using Data Compression" filed on Mar. 4, 2009.

Sommer, N., U.S. Appl. No. 12/171,797 "Memory Device with Non-Uniform Programming Levels" filed on Jul. 11, 2008.

Shalvi et al., U.S. Appl. No. 12/251,471 "Compensation for Voltage Drifts in Analog Memory Cells" filed on Oct. 15, 2008.

Bez et al., "Introduction to Flash Memory," Proceedings of the IEEE, vol. 91, No. 4, Apr. 2003, pp. 489-502.

Eitan et al., "Multilevel Flash Cells and their Trade-Offs," Proceedings of the 1996 IEEE International Electron Devices Meeting (IEDM)5 New York, New York, pp. 169-172.

Jung et al., "A 117-mm2 3.3-V Only 128-Mb Multilevel NANAD Flash Memory for Mass Storage Applications," IEEE Journal of Solid State Circuits, vol. 31, No. 11, Nov., 1996, pp. 1575-1583.

Takeuchi et al., "A Multipage Cell Architecture for High-Speed Programming Multilevel NAND Flash Memories," IEEE Journal of Solid-State Circuits, vol. 33, No. 8, Aug. 1998, pp. 1228-1238.

U.S. Appl. No. 60/747,106 (May 12, 2006).

Goodman and Sayano, "On-Chip ECC for Multi-Level Random Access Memories," Proceedings of the 1989 IEEE/CAM Information Theory Workshop, Jun. 25-29, 1989, Ithaca, New York.

U.S. Appl. No. 60/886,429 (Jan. 24, 2007).

U.S. Appl. No. 60/863,810 (Nov. 1, 2006).

U.S. Appl. No. 60/821,764 (Aug. 8, 2006).

U.S. Appl. No. 60/867,401 (Nov. 28, 2006).

Horstein, "On the Design of Signals for Sequential and Nonsequential Detection Systems with Feedback," IEEE Transactions on Information Theory, vol. IT-12, No. 4, Oct. 1966, pp. 448-455.

U.S. Appl. No. 12/019,011 Official Action dated Nov. 20, 2009.

US 7,161,836, 01/2007, Wan et al. (withdrawn)

* cited by examiner

REDUCING PROGRAMMING ERROR IN MEMORY DEVICES

CROSS-REFERENCE TO RELATED APPLICATIONS

This application claims the benefit of U.S. Provisional Patent Application 60/747,106, filed May 12, 2006; U.S. Provisional Patent Application 60/821,764, filed Aug. 8, 2006; and U.S. Provisional Patent Application 60/863,810, filed Nov. 1, 2006; and U.S. Provisional Patent Application 60/867,401, filed Nov. 28, 2006. All of these related applications are incorporated herein by reference.

FIELD OF THE INVENTION

The present invention relates generally to memory devices, and specifically to methods and devices for reducing errors in data storage and readout.

BACKGROUND OF THE INVENTION

Several types of memory devices, such as Flash memories and Dynamic Random Access Memory (DRAM), use arrays of analog memory cells for storing data. Flash memory devices are described, for example, by Bez et al., in "Introduction to Flash Memory," *Proceedings of the IEEE* 91:4 (April, 2003), pages 489-502, which is incorporated herein by reference. In such memory devices, each analog memory cell typically comprises a transistor, which holds a certain amount of electric charge that represents the information stored in the cell. The electric charge written into a particular cell influences the "threshold voltage" of the cell, i.e., the voltage that needs to be applied to the cell so that the cell will conduct current.

Some memory devices, commonly referred to as Single-Level Cell (SLC) devices, store a single bit of information in each memory cell. Typically, the range of possible threshold voltages of the cell is divided into two regions. A voltage value falling in one of the regions represents a "0" bit value, and a voltage belonging to the second region represents "1". Higher-density devices, often referred to as Multi-Level Cell (MLC) devices, store more than one bit per memory cell. In multi-level cells, the range of threshold voltages is divided into more than two regions, with each region representing more than one bit.

Multi-level Flash cells and devices are described, for example, by Eitan et al., in "Multilevel Flash Cells and their Trade-Offs," *Proceedings of the* 1996 *IEEE International Electron Devices Meeting (IEDM)* (New York, N.Y.), pages 169-172, which is incorporated herein by reference. The paper compares several kinds of multilevel Flash cells, such as common ground, DINOR, AND, NOR and NAND cells. Other types of analog memory cells that are known in the art include Nitride Read Only Memory (NROM), Ferroelectric RAM (FRAM), Magnetic RAM (MRAM) and Phase change RAM (PRAM, also referred to as Phase Change Memory—PCM).

In some applications, the data stored in the memory device is encoded using an Error Correcting Code (ECC). For example, Rodney and Sayano describe a number of on-chip coding techniques for the protection of Random Access Memory (RAM) devices, which use multi-level storage cells, in "On-Chip ECC for Multi-Level Random Access Memories," *Proceedings of the* 1989 *IEEE/CAM Information Theory Workshop* (Jun. 25-29, 1989, Ithaca, N.Y.), which is incorporated herein by reference. As another example, U.S. Pat. No. 6,212,654, whose disclosure is incorporated herein by reference, describes methods for storing data in an analog memory device using coded modulation techniques. Other ECC schemes for multilevel memory devices are described in U.S. Pat. Nos. 6,469,931 and 7,023,735, whose disclosures are incorporated herein by reference.

The threshold voltage values read from analog memory cells are sometimes distorted. The distortion may be due to various causes, such as electrical field coupling from neighboring memory cells, disturb noise caused by operations on other cells in the array, and threshold voltage drift caused by device aging. Some common distortion mechanisms are described in the article by Bez et al., cited above.

U.S. Pat. No. 5,867,429, whose disclosure is incorporated herein by reference, describes a method for compensating for electric field coupling between floating gates of a high-density Flash Electrically Erasable Programmable Read Only Memory (EEPROM) cell array. A reading of a cell is compensated by first reading the states of all cells that are field-coupled with the cell being read. A number related to either the floating gate voltage or the state of each coupled cell is then multiplied by the coupling ratio between the cells. The breakpoint levels between states for each of the cells are adjusted by an amount that compensates for the voltage coupled from adjacent cells.

SUMMARY OF THE INVENTION

Embodiments of the present invention provide a method for storing data in an array of analog memory cells. The method includes defining a constellation of voltage levels to be used in storing the data in the analog memory cells, and writing a part of the data to a first analog memory cell in the array by applying to the analog memory cell a first voltage level selected from the constellation. After writing the part of the data to the first analog memory cell, a second voltage level that does not belong to the constellation is read from the first analog memory cell. A modification to be made in writing to one or more of the analog memory cells in the array is determined responsively to the second voltage level. Data are written to the one or more of the analog memory cells subject to the modification.

In some embodiments, determining the modification includes selecting one or more third voltage levels to be written respectively to one or more of the analog memory cells, and writing to the one or more of the analog memory cells includes writing the one or more third voltage levels to the one or more of the analog memory cells.

In a disclosed embodiment, selecting the one or more third voltage levels includes determining a voltage correction to be applied to the first analog memory cell, and writing the one or more third voltage levels includes adding charge to the first analog memory cell so as to apply the voltage correction. Typically, defining the constellation includes defining a matrix of codewords to represent the data, each codeword corresponding to a set of the voltage levels in the constellation that are to be written to a corresponding set of the analog memory cells, and determining the voltage correction includes finding a distance between the set of the voltage levels, including the second voltage level, read from the corresponding set of the analog memory cells and one of the codewords in the matrix, and choosing the voltage correction so as to reduce the distance.

Writing the part of the data may include choosing a first codeword in the matrix to be written to the corresponding set of the analog memory cells, and finding the distance may include determining a first distance between the set of the voltage levels and the first codeword and a second distance between the set of the voltage levels and a second codeword in proximity to the first codeword, whereupon choosing the voltage correction includes computing the voltage correction so as to reduce a ratio of the first distance to the second distance.

Alternatively, the method may include, when the distance exceeds a maximal distance criterion, rewriting the part of the data to the first analog memory cell.

In another embodiment, selecting the one or more third voltage levels includes selecting a third voltage level from the constellation to be written to a second analog memory cell. Typically, selecting the third voltage level includes choosing the third voltage level responsively to both the first voltage level and the second voltage level, while applying feedback coding so as to write multiple successive voltage levels representing the data to a succession of the analog memory cells.

Applying the feedback coding may include choosing the first voltage level responsively to a probability density function (PDF), which relates the data to the voltage levels that are to be used in storing the data in the analog memory cells, and choosing the third voltage level may include updating the PDF responsively to the first and second voltage levels, and choosing the third voltage level responsively to the updated PDF. When the constellation includes $2^M$ voltage levels in each of the analog memory cells, wherein M>1, and choosing the third voltage level may include partitioning the PDF into $2^M$ sub-intervals corresponding to the $2^M$ voltage levels, selecting one of the sub-intervals responsively to a value of the data, and choosing the third voltage level that corresponds to the selected one of the sub-intervals.

Additionally or alternatively, writing the part of the data may include writing respective first voltage levels to a first group of the memory cells in a first row in the array, wherein the second analog memory cell belongs to a second group of the memory cells in a second row of the array, to which the one or more third voltage levels are written after writing to the memory cells in the first row, and wherein each of the memory cells is located in a respective column, and selecting the third voltage level includes determining a respective third voltage level to write to each of the memory cells in the second group responsively to the second voltage level read from one of the first group of the memory cells in the same respective column.

Further additionally or alternatively, writing the part of the data may include simultaneously writing respective first voltage levels to a first group of the memory cells in a first row in the array, wherein the first and second analog memory cells are chosen from among the memory cells in the group responsively to an ordering of the voltage levels to be written to the memory cells.

In some embodiments, the constellation has a first voltage resolution, and reading the second voltage level includes determining the second voltage level with a second voltage resolution that is finer than the first voltage resolution.

Typically, the memory cells are selected from a set of memory cell types consisting of Flash memory cells, Dynamic Random Access Memory (DRAM) cells, Phase Change Memory (PCM) cells, Nitride Read-Only Memory (NROM) cells, and Magnetic Random Access Memory (MRAM) cells.

In a disclosed embodiment, the constellation of the voltage levels includes at least four voltage levels per cell.

In some embodiments, the constellation is modified responsively to the second voltage level. In one embodiment, modifying the constellation includes increasing at least one of the voltage levels to be used in storing the data.

In other embodiments, the modification includes changing a number of error correction bits that are to be added to a word of the data.

There is also provided, in accordance with an embodiment of the present invention, apparatus for storing data, including:

a read/write unit, which is coupled to an array of analog memory cells so as to write a part of the data to a first analog memory cell in the array by applying to the analog memory cell a first voltage level selected from a predefined constellation of voltage levels, and which is configured to read from the first analog memory cell, after writing the part of the data thereto, a second voltage level that does not belong to the constellation; and a signal processing unit, which is configured to determine, responsively to the second voltage level, a modification to be made in writing to one or more of the analog memory cells in the array, and to instruct the read/write unit to write to the one or more of the analog memory cells subject to the modification.

The present invention will be more fully understood from the following detailed description of the embodiments thereof, taken together with the drawings in which:

DETAILED DESCRIPTION OF EMBODIMENTS

Overview

Some analog memory devices use a process of "program and verify" (P&V) in writing information to the memory cells. In a typical P&V process, a cell is programmed by applying a sequence of voltage pulses, whose voltage level increases from pulse to pulse. The programmed voltage level is read ("verified") after each pulse, and the iterations continue until the desired level is reached. P&V processes are described, for example, by Jung et al., in "A 117 mm² 3.3V Only 128 Mb Multilevel NAND Flash Memory for Mass Storage Applications," *IEEE Journal of Solid State Circuits* 11:31 (November, 1996), pages 1575-1583, and by Takeuchi et al., in "A Multipage Cell Architecture for High-Speed Programming Multilevel NAND Flash Memories," *IEEE Journal of Solid-State Circuits* 33:8 (August,), pages 1228-1238, which are both incorporated herein by reference.

The embodiments of the present invention that are described hereinbelow improve upon the conventional program-and-verify model by measuring the voltages of analog memory cells against a set of levels that are different from the constellation of levels that correspond to the data values that may be written to the cells. Typically, although not necessarily, the set of levels used in measuring the cell voltages has finer resolution, i.e., is more tightly spaced, than the set of levels in the write constellation. The measured voltage levels may then be used, for example, in providing fine correction to the amount of charge already stored in the cells, or in a feedback coding scheme for determining the voltage levels to be used in writing to subsequent cells in the array.

These fine correction and measurement schemes increase the accuracy of programming the memory and thus reduce the likelihood of data error at readout. Such schemes may thus be used in enhancing memory reliability or, alternatively or additionally, in achieving increased storage density and/or lifetime.

System Description

Figure 1:
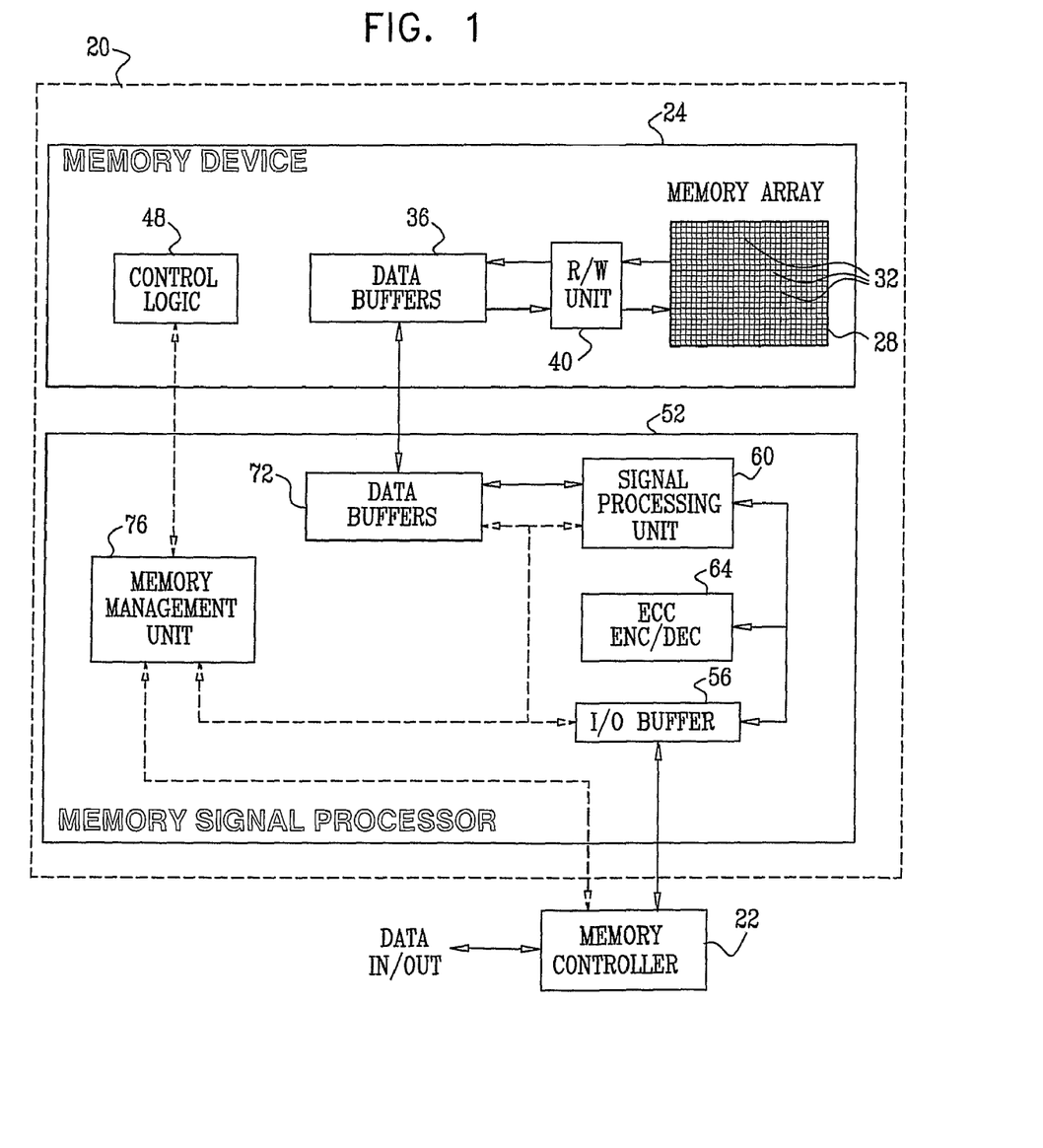
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules (such as "disk-on-key" devices), digital cameras, music and other media players and/or any other system or device in which data is stored and retrieved. In a typical application, memory system 20 interacts with a memory controller 22, i.e., accepts data for storage from the memory controller and outputs data that are stored in memory to the memory controller when requested.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND or NOR Flash cells, or PCM, NROM, FRAM, MRAM or DRAM cells. The charge levels stored in the cells and/or the analog voltages written into and read out of the cells are referred to herein collectively as analog values.

Data for storage in memory device 24 are provided to the device and cached in data buffers 36. The data are then converted to analog voltages and written into memory cells 32 using a reading/writing (R/W) unit 40, whose functionality is described in greater detail below. When reading data out of array 28, unit 40 converts the electric charge, and thus the analog voltages, of memory cells 32, into digital samples. The samples are cached in buffers 36. The samples produced by unit 40 are referred to as soft samples. The operation and timing of memory device 24 are managed by control logic 48.

Storage and retrieval of data in and out of memory device 24 are performed by a Memory Signal Processor (MSP) 52. MSP 52 intermediates between memory device 24 and memory controller 22 or other host. As will be shown in detail hereinbelow, MSP 52 applies novel methods in determining the analog values that are to be written to memory array 28 in order to improve the reliability and storage density of the data.

MSP 52 comprises an encoder/decoder 64, which typically encodes the data to be written to device 24 using an error correcting code (ECC), and decodes the ECC when reading data out of device 24. A signal processing unit 60 processes the data that are written into and retrieved from device 24. In particular, as data are programmed into cells 32, unit 60 receives digital samples that are indicative of the measured voltage levels of the cells, and then determines further voltage levels to be written (to the same cells and/or other cells) on this basis. Techniques that may be used by unit 60 for this purpose are described in detail hereinbelow with reference to FIGS. 4-6. Alternatively or additionally, these techniques may be implemented, mutatis mutandis, in the circuitry of memory device 24, and specifically in R/W unit 40.

MSP 52 comprises a data buffer 72, which is used by unit 60 for storing data and for interfacing with memory device 24. MSP 52 also comprises an Input/Output (I/O) buffer 56, which forms an interface between the MSP and the host. A memory management unit 76 manages the operation and timing of MSP 52. Signal processing unit 60 and management unit 76 may be implemented in hardware. Alternatively, unit 60 and/or unit 76 may comprise microprocessors that run suitable software, or a combination of hardware and software elements. Further alternatively, memory controller 22 or even a host processor may be configured to carry out some or all of the functions of the signal processing and management units that are described hereinbelow, as well as other functions of MSP 52.

The configuration of FIG. 1 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits, data scrambling circuits and debugging circuits, have been omitted from the figure for clarity.

In the exemplary system configuration shown in FIG. 1, memory device 24 and MSP 52 are implemented as two separate Integrated Circuits (ICs). In alternative embodiments, however, the memory device and MSP may be integrated in a single IC or System on Chip (SoC). In some implementations, a single MSP 52 may be connected to multiple memory devices 24. Additional architectural and functional aspects of system 20 and other possible embodiments of the present invention are described in greater detail in U.S. Provisional Patent Application 60/867,399 and in a PCT patent application entitled, "Combined Distortion Estimation and Error Correction Coding for Memory Devices," filed on even date, both of which are incorporated herein by reference.

In a typical writing operation, data to be written into memory device 24 are accepted from the host and cached in I/O buffer 56. Encoder/decoder 64 encodes the data, and the encoded data are transferred, via data buffers 72, to memory device 24. In device 24 the data are temporarily stored in buffers 36. R/W unit 40 converts the data to analog voltage values and writes the data (as analog voltage values) into the appropriate cells 32 of array 28. After writing the analog voltage values to a cell or group of cells, R/W unit 40 reads the analog voltage values from the cell(s) and converts the voltages to soft digital samples. The samples are cached in buffers 36 and transferred to buffers 72 of MSP 52. Signal processing unit 60 processes the data samples, using methods that are described hereinbelow, in order to determine data values to be written subsequently by R/W unit.

When data are to be read out of system 20 to controller 22, R/W unit 40 reads the analog voltage values from the appropriate cells and converts these voltage values to digital samples in buffers 36. Blocks of data are transferred from buffers 72 to unit 60, and encoder/decoder 64 decodes the ECC of these blocks. Encoder/decoder 64 may use distortion estimation provided by unit 60 to improve the performance of the ECC decoding process (as described in the above-mentioned PCT patent application). The decoded data are transferred via I/O buffer 56 to the memory controller or host.

Memory Array Structure and Programming

Figure 2:
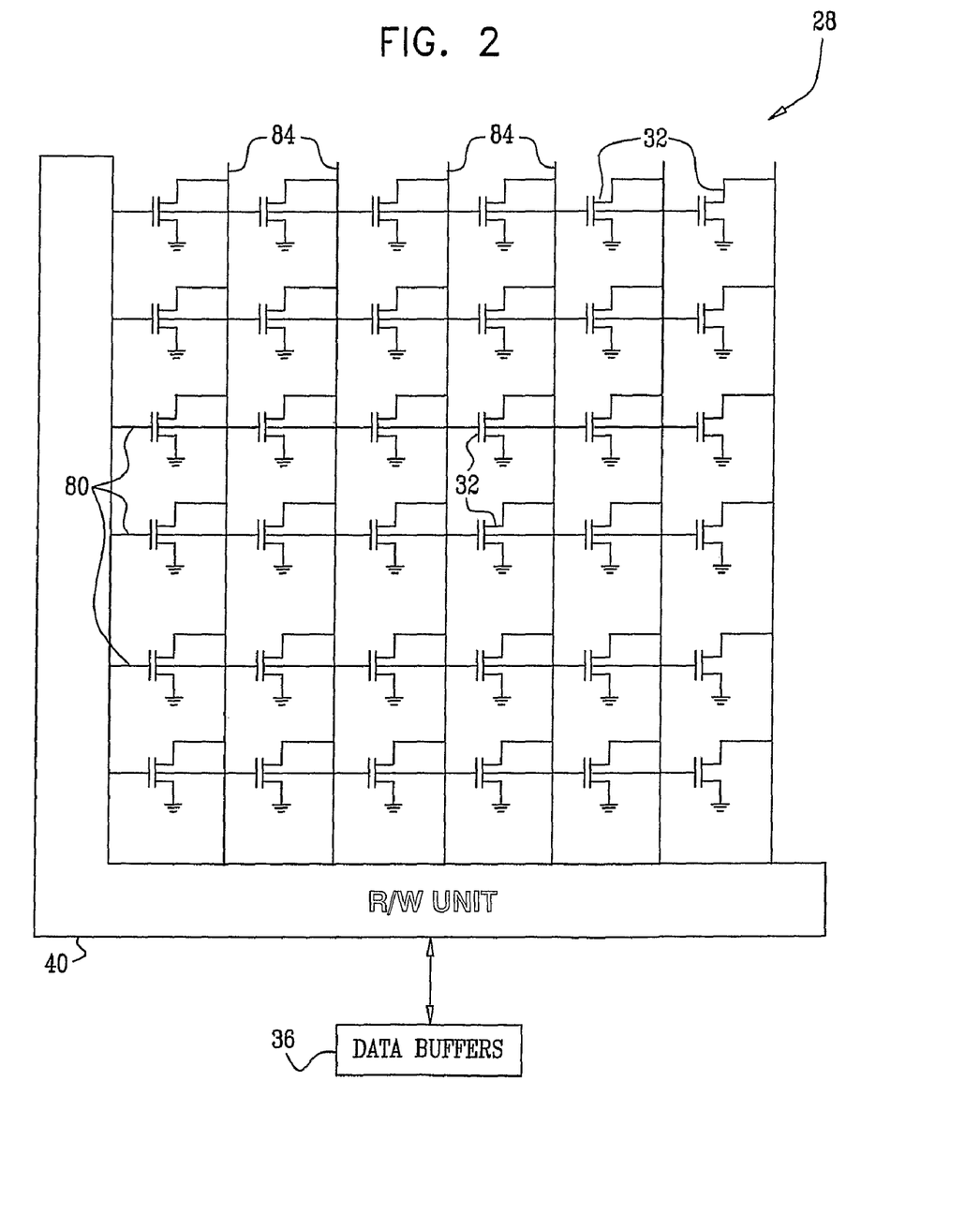
FIG. 2 is a schematic circuit diagram that illustrates a memory cell array, in accordance with an embodiment of the present invention.

FIG. 2 is a diagram that schematically illustrates memory cell array 28, in accordance with an embodiment of the present invention. Although cells 32 in FIG. 2 represent Flash memory cells, which are connected in a particular array configuration, the principles of the present invention are applicable to other types of memory cells and other array configurations, as well. Some exemplary cell types and array configurations that may be used in this context are described in the references cited in the Background section above.

Memory cells 32 of array 28 are arranged in a grid having multiple rows and columns. Each cell 32 comprises a floating-gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that must be applied to the gate of the transistor in order to cause the transistor to conduct. The read threshold voltage is indicative of the charge stored in the cell.

In the exemplary configuration of FIG. 2, the gates of the transistors in each row are connected by word lines 80. The sources of the transistors in each column are connected by bit lines 84. In some embodiments, such as in some NOR cell devices, the sources are connected to the bit lines directly. In alternative embodiments, such as in some NAND cell devices, the bit lines are connected to strings of floating-gate cells.

Typically, R/W unit 40 reads the threshold voltage of a particular cell 32 by applying varying voltage levels to its gate (i.e., to the word line to which the cell is connected) and checking whether the drain current of the cell exceeds a certain threshold (i.e., whether the transistor conducts). Unit 40 usually applies a sequence of different voltage values to the word line to which the cell is connected, and determines the lowest gate voltage value for which the drain current exceeds the threshold. Unit 40 then outputs a digital sample to data buffers 36 corresponding to this gate voltage, thus indicating the voltage level of the cell. Typically, unit 40 reads an entire row of cells, also referred to as a page, simultaneously. Alternatively, unit 40 may read cells individually.

In some embodiments, unit 40 measures the drain current by pre-charging the bit line of the cell to a certain voltage level. Once the gate voltage is set to the desired value, the drain current causes the bit line voltage to discharge through the cell. Unit 40 measures the bit line voltage several microseconds after the gate voltage is applied, and compares the bit line voltage to the threshold. In some embodiments, each bit line 84 is connected to a respective sense amplifier (not shown in the figures), which compares the bit line voltage to the threshold using a comparator.

The above method of voltage reading is described solely by way of example. Alternatively, R/W unit 40 may use any other suitable method for reading the threshold voltages of cells 32. For example, unit 40 may comprise one or more Analog to Digital Converters (not shown in the figures), which convert the bit line voltages to digital samples.

In some embodiments, entire pages (rows) are written and read in parallel. Typically, adjacent pages are written in succession, one after another. In alternative embodiments, cells are written sequentially across each row and may likewise be read sequentially.

Figure 3:
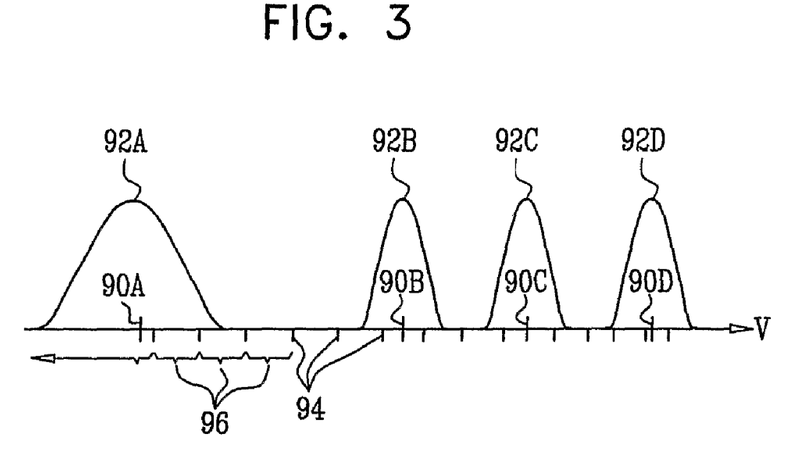
FIG. 3 is a schematic plot of voltage distribution in an array of multi-level memory cells, in accordance with an embodiment of the present invention.

FIG. 3 is a schematic plot showing voltage distributions in memory cell array 28, in accordance with an embodiment of the present invention. FIG. 3 demonstrates inaccuracy that can occur in writing values to the memory cell array. In the example of FIG. 3, each cell 32 stores two bits of information using a constellation of four nominal threshold voltage levels. In order to store two data bits in a memory cell, R/W unit 40 writes one of the four nominal voltage levels into the cell. In the present example, voltage level 90A corresponds to "11" bit values. Voltage levels 90B . . . 90D correspond to "01", "00" and "10" bit values, respectively.

Although the R/W unit writes a particular nominal voltage level, the actual threshold voltage level of the cell usually deviates from the nominal level, because of distortion mechanisms and other nonuniformities. Curves 92A . . . 92D show an exemplary voltage distribution created during the initial program stage of a program-and-verify procedure. Curve 92A shows the distribution of voltages in the cells that store "11" bit values. Curves 92B, 92C and 92D show the voltage distribution in the cells that store "01", "00" and "10" bit values, respectively.

For purposes of verification, a different set of voltage levels is used—in this case a set of levels with finer resolution than the constellation of write voltages represented by levels 90A . . . 90D. The total range of threshold voltages is divided in this example into sixteen intervals 96 by defining fifteen read thresholds 94. Thus, R/W unit 40 reads the threshold voltage levels of the memory cells using four-bit conversion, depending on the decision interval in which the threshold level read from the cell falls. MSP 52 uses this readout in determining voltages to be written to array 28 subsequently, as described in detail hereinbelow. The particular read thresholds and intervals shown in FIG. 3 were chosen solely by way of example. The R/W unit may alternatively use different read thresholds, at different voltages and at higher or lower resolution (bits/sample), depending on performance requirements.

Correcting Cell Voltage Values

Figure 4:
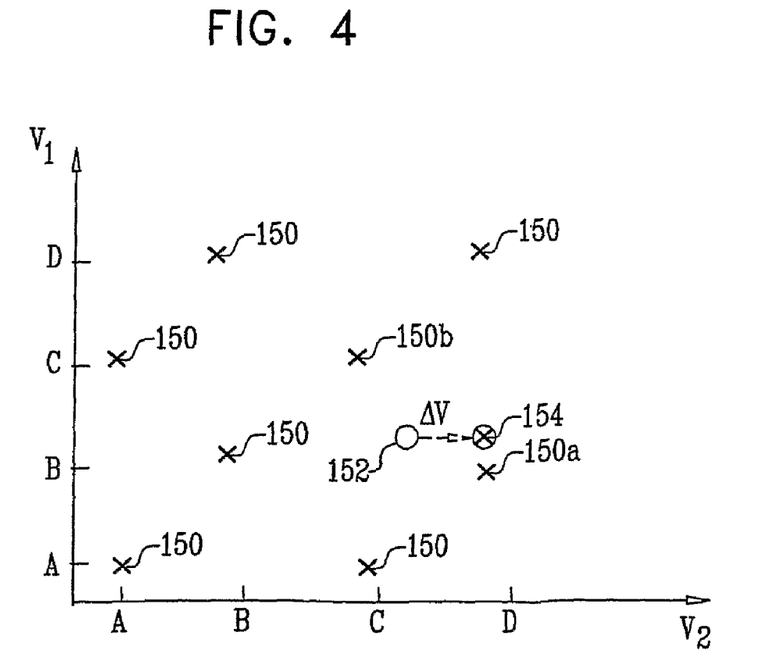
FIG. 4 is a schematic plot of constellation points and voltage values used in programming a memory device with encoded data, in accordance with an embodiment of the present invention.

FIG. 4 is a schematic plot of a matrix of constellation points 150 and corresponding voltage values used in programming memory device 24 with encoded data, in accordance with an embodiment of the present invention. Each constellation point 150 represents a legal codeword. As explained above, encoder/decoder 64 encodes input data words that are to be written to memory array 28 in multi-bit codewords, which are then stored over groups of cells 32. The size of the group of cells depends on the length of the codeword, and may typically extend over an entire page of the array. In this example, however, for the sake of simplicity, it is assumed that three bits of input data are encoded at rate ¾ and are thus stored as a four-bit codeword in two cells. The two bits stored in each cell are represented by respective voltage levels $V_1$ and $V_2$, which may be set to values A, B, C and D. Points 150 in the codeword constellation represent the eight pairs of voltage values that may legally correspond to input data words. More generally, if each codeword in a given coding scheme is to be stored over a group of m cells, then the constellation of legal voltage values could be represented as a matrix of points in an m-dimensional space.

As explained above, the actual voltage values read from cells 32 in array 28 typically spread over a range of values around the nominal values represented by constellation points 150. Thus, in the example shown in FIG. 4, a pair of cells, represented by the respective voltage levels $V_1$ and $V_2$, were programmed with an intent to write the voltages represented by a target constellation point 150a. Because of distortion mechanisms and programming inaccuracies, however, the actual voltages of the cells, represented by an initial point 152, may deviate on one or both axes from the nominal values of target constellation point 150$a$. As a result, when the voltage values are subsequently read out and decoded, the codeword may be erroneously identified as corresponding to another nearby constellation point 150$b$ (particularly if distortion mechanisms in device 24 cause a subsequent shift in the voltage values that are read out).

In order to reduce the effect of this sort of error, R/W unit 40 reads out the voltage levels $V_1$ and $V_2$ in the verify stage with resolution that is finer than the nominal resolution of the constellation, as illustrated by thresholds 94 and intervals 96 in FIG. 3. Signal processing unit 60 (or alternatively, the R/W unit itself) determines a voltage addition $\Delta V$ that may be applied to one or more of the cells so as to bring the voltage levels to a corrected point 154 that is closer to target constellation point 150$a$, without approaching any of the other constellation points. An exemplary method for this purpose is described below with reference to FIG. 5. This correction mechanism reduces the likelihood of error upon readout. It can thus be used to enhance the reliability of system 20 or, alternatively or additionally, to permit the storage of data in the system with greater density.

Figure 5:
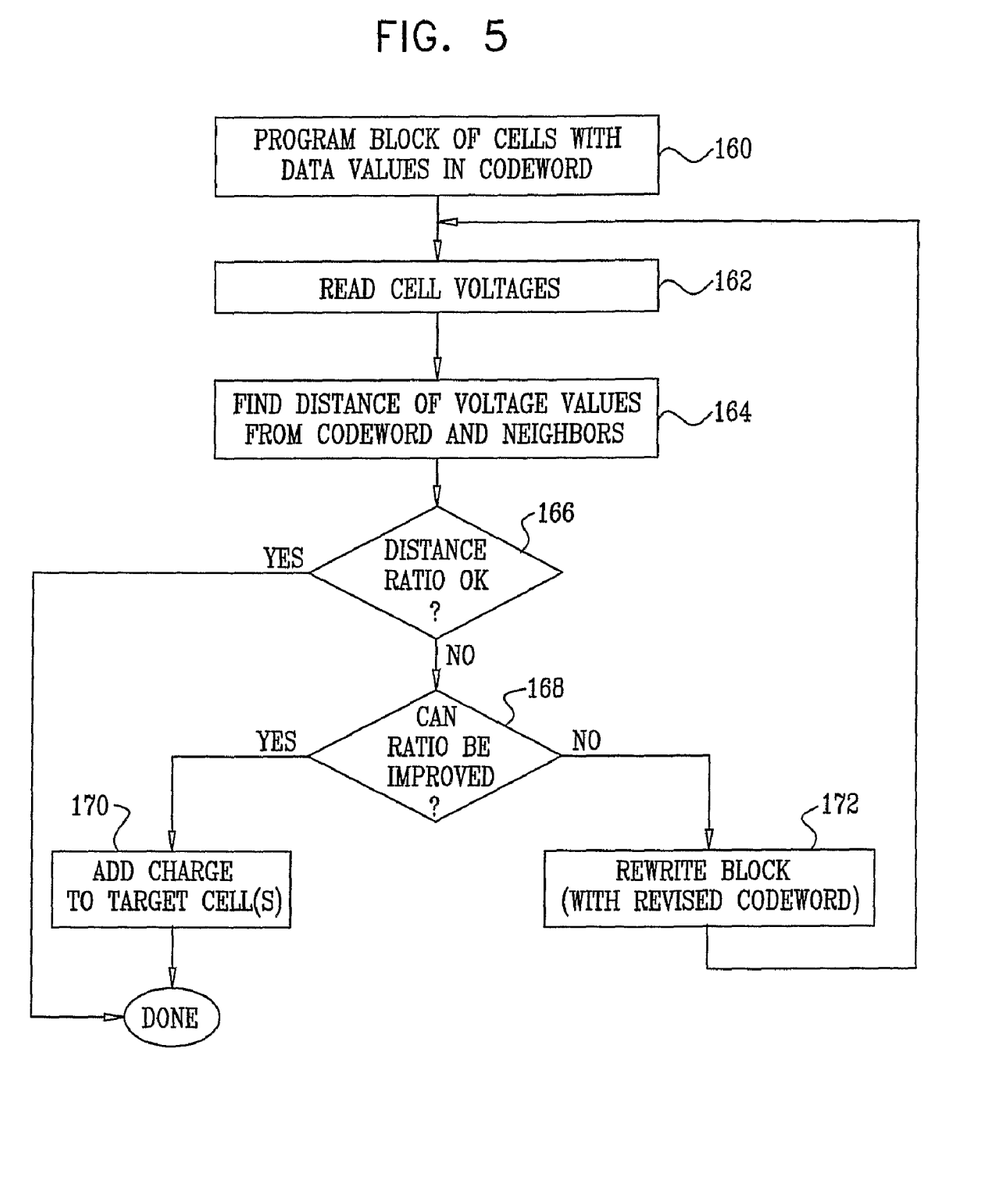
FIG. 5 is a flow chart that schematically illustrates a method for programming a memory device, in accordance with an embodiment of the present invention.

FIG. 5 is a flow chart that schematically illustrates a method for programming memory device 24, in accordance with an embodiment of the present invention. Initially, as explained above, R/W unit 40 programs a block of cells 32, such as a page, in array 28 with the nominal voltage levels of the constellation point corresponding to the bits of a codeword generated by MSP 52, at a program step 160. The R/W unit then reads out the voltage levels of the cells in the block that it has programmed, at a verification step 162. As noted above, the readout is performed using a different set of voltage levels from the nominal write levels used at step 160. Typically, the readout is performed with finer resolution, using thresholds 94 (FIG. 3), for example. The R/W unit passes the voltage levels that it has read out, in the form of digital sample values, to signal processing unit 60.

The signal processing unit finds the location of initial point 152 corresponding to this set of voltage readout values in the m-dimensional constellation space, and calculates the distance of the initial point from the target constellation point, at a distance computation step 164. Any suitable distance measure, such as the Euclidean (sum of squares) distance, may be used at this step. The signal processing unit may also find the distances from the initial point to other nearby constellation points. Referring to the example shown in FIG. 4, the signal processing unit will find the distances from point 152 to points 150$a$ and 150$b$, and possibly to other nearby constellation points.

Signal processing unit 60 compares the distance from the initial point to target point 150$a$ with the distances to other constellation points, at a distance checking step 166. For example, the signal processing unit may find the ratio of these distances. If the ratio is smaller than a predefined threshold, for example, less than ½, then the signal processing unit may conclude that the present codeword has been written correctly, and may proceed to the next block of cells. Alternatively or additionally, another threshold may be defined such that if the distance from the initial point to target 150$a$ is smaller than then threshold, then the signal processing unit concludes that the present codeword has been written correctly, without reference to the ratio.

If the ratio is too large, however, the signal processing unit checks whether it is possible to improve the ratio by correcting the voltage in one or more of the cells in the present block, at a correction checking step 168. Typically, the signal processing unit determines whether, by adding charge to one or more of the cells, it will be possible to decrease the ratio, i.e. to bring the set of cell voltages closer to the target constellation point without reducing substantially the distances to other constellation points. In the example shown in FIG. 4, adding charge corresponding to voltage $\Delta V$ to one of the cells will bring the voltage levels from initial point 152 to corrected point 154, which is near target point 150$a$ and farther from point 150$b$. The signal processing unit instructs R/W unit 40 to apply the appropriate voltage to the cell or cells in question, at a charge addition step 170. The new charge level may optionally be verified, and the process then moves on to the next codeword.

Alternatively, signal processing unit 60 may conclude at step 168 that it is not possible to correct the initial point written at step 160. The reason may be that the initial point is too far from the target point to be effectively corrected by addition of charge to the cells, or that attempting to correct the voltage will bring the point too close to an incorrect constellation point, or that charge must be removed from one or more of the cells (which is not possible without erasure of the cells). In this case, the signal processing unit may instruct R/W unit 40 to rewrite the entire block. Optionally, the codeword may be revised before writing to contain a greater number of bits, by adding parity bits, for example (or the number of data bits encoded by the codeword may be reduced), thereby effectively spacing constellation points 150 farther apart in the constellation space. Increasing the size of the codeword in this manner effectively reduces the information capacity of the block in question. Methods for adapting information storage to the achievable capacity of memory cells in an array are described further, for example, in a PCT patent application entitled "Memory Device with Adaptive Capacity," filed on even date, which is assigned to the assignee of the present patent application and whose disclosure is incorporated herein by reference.

The R/W unit then returns to verify the rewritten block at step 162, and the process of verification and possible correction is repeated, as described above. If the signal processing unit returns to step 168 and again finds the point written at step 172 to be too far from the target point, it may mark the current block in array 28 as a bad block, and then proceed to rewrite the current codeword to another block in the array.

The addition of charge to target cells at step 170 is useful when the cell voltage is found at step 164 to be lower than that of the target point. Alternatively, in some cases, such as when the measured cell voltage is above that of the target point, MSP 52 may decide to modify the constellation, typically by increasing the voltage levels of the constellation. (A drawback of this approach is that the use of higher programming voltages may cause a high level of wear to the memory cells.) The MSP may add to the data an indication that the constellation levels have been increased, by setting a flag, for example.

Although the method of FIG. 5 is described above in the context of correcting cell voltages at the time of programming, the principle of this method may be applied at long periods (even years) after programming, in order to combat distortions due to aging and leakage current.

Reducing Programming Errors Using Feedback

Figure 6:
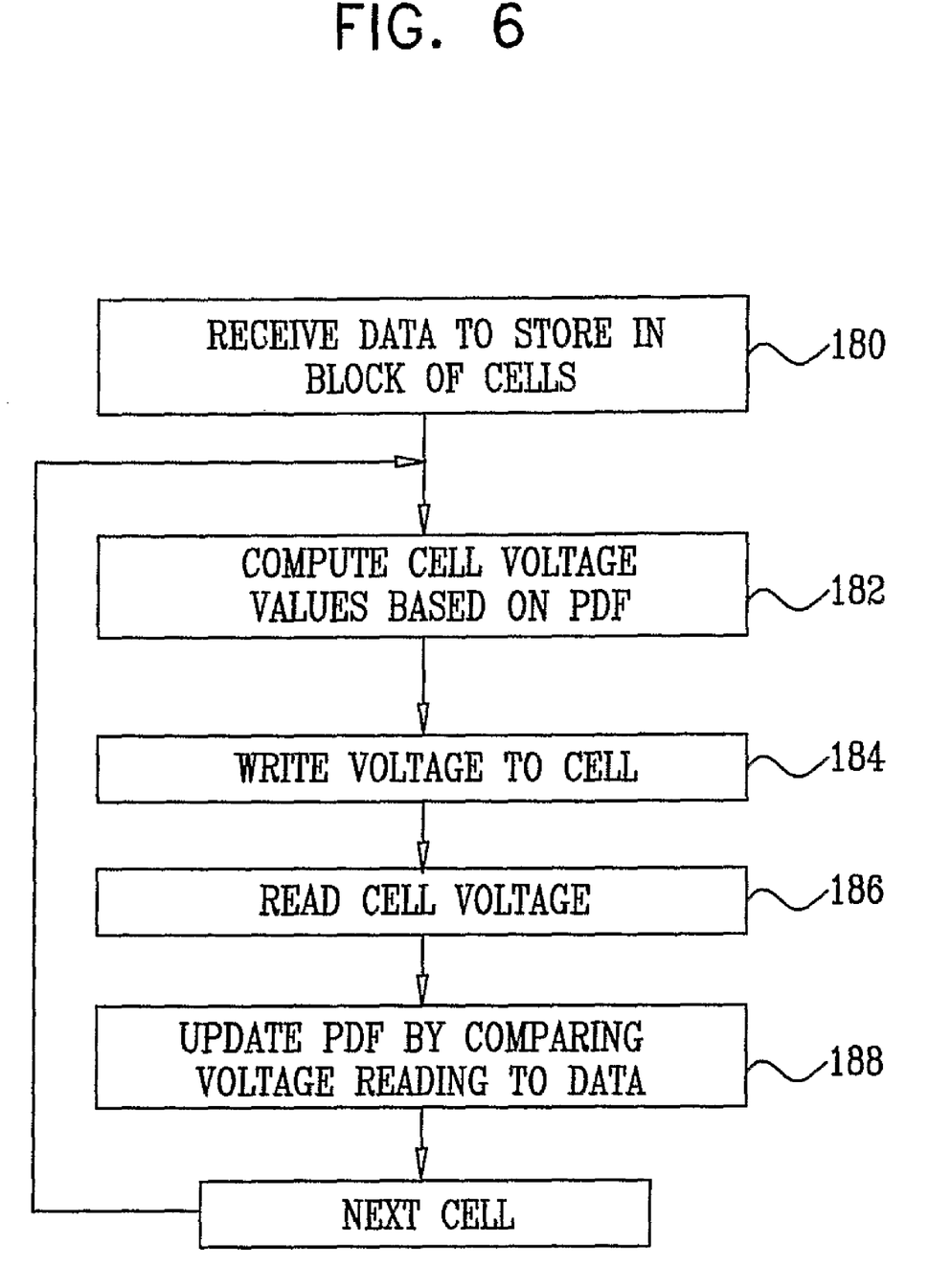
FIG. 6 is a flow chart that schematically illustrates a method for programming a memory device, in accordance with another embodiment of the present invention.

FIG. 6 is a flow chart that schematically illustrates a method for programming device 24, in accordance with another embodiment of the present invention. This method uses feedback coding, in which signal processing unit 60 applies the values of voltage written to preceding cells in determining the voltage to be written to the current cell. The basic principles of feedback coding in communication systems are described, for example, by Horstein, in "On the Design of Signals for Sequential and Nonsequential Detection Systems with Feedback," *IEEE Transactions on Information Theory* IT-12:4 (October, 1966), pages 448-455, which is incorporated herein by reference.

The method of FIG. 6 is initiated when signal processing unit 60 receives a data word (or a sequence of multiple words) to be written to array 28, at a data reception step 180. In Flash memories, as noted above, each word may correspond to an entire page (row) of cells 32, and the voltage values corresponding to the bits of the word may be written to all the cells in the page simultaneously. Furthermore, these voltage values may correspond to two or more bits per cell. For purposes of simplicity in the present explanation, however, it will first be assumed that the cell voltages are written to the array sequentially, cell by cell, and that the voltages represent a single bit per cell. Extensions of the principles of this method to multiple bits per cell and to simultaneous programming of multiple cells are described further hereinbelow.

For the sake of the feedback coding scheme, the sequence of bits that is to be written to a sequential group of cells is represented as a "floating point" number x, wherein $0 \leq x < 1$. In other words, the information bits to be stored in the array are the bits in the binary 2's complement representation of x, normalized to the range $0 \leq x < 1$, starting from the most significant bit (MSB) and moving sequentially to the right. Signal processing unit 60 determines the voltage value to be written to each cell by applying a probability distribution function (PDF) to the bits in x, at a voltage computation step 182. For purposes of computing the PDF in the simplified method that follows, array 28 is assumed to behave as a binary symmetric channel (BSC), meaning that each bit is written correctly to a cell in the array with probability $1-p$, or incorrectly with error probability p. Before writing the first bit, the PDF is uniform over the interval [0,1). Alternatively, the method may be adapted to use other representations of error probability and PDF, such as a Gaussian representation.

In the first iteration through step 182, using the initial PDF, signal processing unit 60 instructs R/W unit 40 to write the voltage value corresponding to "1" to the first cell in the block in question if $x > 0.5$ and "0" otherwise. The R/W unit writes this value to the first cell, at a writing step 184. It then reads out the voltage value that is actually recorded in the cell, at a reading step 186. As noted above, the R/W unit typically reads out the voltage value with higher resolution than the binary constellation of write levels.

The signal processing unit updates the PDF based on the voltage value read from the cell, at a PDF update step 188. After the first iteration through step 188, the PDF will be piecewise-constant with two levels, according whether the voltage read from the cell was above or below the nominal threshold voltage between the "1" and "0" voltage values. For example, if the voltage read from the cell corresponds to "1", the signal processing unit will set the PDF to equal $2(1-p)$ for $0.5 < x < 1$ and $2p$ for $0 < x < 0.5$. (In contrast to the method of FIG. 5, the signal processing unit does not attempt to adjust the voltage of the first cell, even if the voltage corresponds to an incorrect bit value, but rather proceeds to program the subsequent cells. The feedback coding scheme implemented by the present method will inherently compensate for these errors while permitting the amount of information actually stored in array 28 to approach the theoretical storage capacity.)

At the next iteration through step 182, to determine the voltage value to be written to the next cell, signal processing unit 60 calculates the median point of the PDF (i.e., the point m for which the probability that $x < m$ is 0.5), in accordance with the latest update of the PDF at step 188. The signal processing unit instructs R/W unit 40 to write a voltage value corresponding to "1" to the next cell if x is larger than the median, and "0" otherwise. The voltage values that are chosen for writing to the cells are thus based both on the values of data bits that are to be stored in the memory and on the values of the voltages that are actually written to the memory.

After programming and reading the appropriate voltage value at steps 184 and 186, the signal processing unit again updates the PDF at step 188. At this iteration, the signal processing unit divides the PDF into three intervals, by splitting either the lower interval ($0 < x < 0.5$) or the upper interval ($0.5 < x < 1$) at the median point found at step 182. It then multiplies the PDF in either the interval above the median or the interval below the median by $(1-p)$, depending on whether the voltage read out of the current cell corresponds to "1" or "0", and multiplies the PDF by p in the other interval. The resulting PDF is then normalized (multiplied by a constant) so that its integral from 0 to 1 will be 1. The PDF will now be piecewise-constant with three levels.

This process continues iteratively, wherein at each pass through step 182, signal processing unit 60 outputs the voltage value corresponding to "1" if x is larger than the current median of the PDF, and "0" otherwise. Over many iterations, the PDF gradually takes the shape of an impulse response at x. The amplitude of the impulse, relative to the baseline PDF (corresponding to other data words), is indicative of the probability of error when the data are read out of array 28. When the probability falls below a predetermined threshold, the iteration terminates.

Errors in writing data to array 28 (i.e., discrepancies between the voltage values read at step 186 and those written at step 184) will delay the buildup of the impulse, but the impulse will eventually build up as long as there are no errors in readout at step 186. It can be shown that under these conditions, this feedback-based coding scheme causes information to be stored in array 28 at a density approaching the theoretical capacity, and also attains the theoretical limit for coding delay. In practice, this method may be combined with other techniques for correcting read errors that may occur in readout of data from array 28.

The method described above may be generalized for use in multi-level memory cells, which store M bits per cell. In this case, each cell has $2^M$ possible input and output levels, with a probability $P(i,j)$ that a level i that is output by signal processing unit 60 will be written to a memory cell as level j. Instead of calculating the median of the PDF at step 182, the signal processing unit finds the $2^{M-1}$ points that partition the interval [0,1) into $2^M$ equiprobable sub-intervals. For each successive cell, the signal processing unit then instructs R/W unit 40 to write the voltage value corresponding to the interval that contains x. The signal processing unit builds up the PDF at step 188 in the same manner, as a piecewise-constant function (but with more sub-intervals than for the binary case).

Although the method described above depends on sequential coding and writing of bits to successive cells, it may be adapted for use in devices, such as Flash memories, in which R/W unit 40 writes data to a group of cells, such as a page (i.e., a row), simultaneously. For this purpose, MSP 52 may code a sequence of words of data that are to be written to successive pages. Since each word is to be written to a corresponding page, it contains one respective symbol to be written to each cell in the page, i.e., one symbol per column. The MSP extracts the symbols in each column of the sequence of words and arranges these symbols in succession so as to define a respective number x for that column, which is then used in determining the values to be written to cells 32 on the corresponding bit line 84. In other words, the symbols in the first column are extracted and arranged in order to define a first word, which is written to the cells on the first bit line, and so forth. The signal processing unit then determines and updates the respective PDF for each bit line of array 28, and uses this specific PDF in determining the voltage value to be written on the corresponding bit line in each page that it sends to R/W unit 40.

It is not necessary that all the symbols that are to go into a respective number x for purposes of feedback coding be known in advance. Rather, the signal processing unit may begin the coding process of FIG. 6 with only one or a few initial symbols, which define the most significant bits of x. As new symbols arrive, the signal processing unit refines the value of x accordingly, so that refinement of the PDF proceeds in parallel with refinement of the number that is stored.

As another alternative, MSP 52 may take advantage of the way in which many Flash memories write data to cells 32 on a common word line 80 in order to perform feedback coding of data within each page. As noted above, in the course of writing a given page, R/W unit 40 applies pulses of gradually increasing voltage on the corresponding word line. When the voltage reaches the level to which a given cell in that page is to be charged, the R/W unit switches the corresponding bit line to stop the charging of that cell. Thus, writing to different cells in the same page will be completed at different times, depending on the respective voltage values that are to be written to the cells. In order to code the values, the signal processing unit arranges them in order of increasing value, which will typically differ from the order of the corresponding cells in the page. The method described above may then be applied, mutatis mutandis.

Alternatively or additionally, feedback techniques may be applied in determining the number of ECC (parity) bits to be used in encoding data. For example, after data have been written to a first group of memory cells, and R/W unit 40 has read out the voltage values from these memory cells, MSP 52 may process these voltage values in order to decide how many ECC parity bits are required to ensure the reliability of the programmed data. ECC encoder 64 than calculates these parity bits for subsequent data, and in the resultant codewords are written to a second group of memory cells. Techniques of this sort for adaptive capacity adjustment are described further in the above-mentioned PCT patent application entitled "Memory Device with Adaptive Capacity."

Although the embodiments described above relate, for the sake of clarity, to the specific device architecture and features shown in FIGS. 1 and 2, the principles of the present invention may similarly be applied in memory devices of other types, including not only solid-state memories, but also disk memories. Furthermore, although these embodiments relate primarily to prevention of errors that may occur in the stages of programming a memory device, the methods described above may be used advantageously in conjunction with other techniques for enhancing reliability and capacity of memory devices based on distortion estimation and correction of errors that may occur at other stages of programming and readout.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for storing data in an array of analog memory cells, the method comprising:
    defining a constellation of voltage levels to be used in storing the data in the analog memory cells;
    writing a part of the data to a first analog memory cell in the array by applying to the analog memory cell a first voltage level selected from the constellation;
    after writing the part of the data to the first analog memory cell, reading from the first analog memory cell a second voltage level that does not belong to the constellation;
    determining, responsively to the second voltage level, a modification to be made in writing to one or more of the analog memory cells in the array; and
    writing to the one or more of the analog memory cells subject to the modification.

2. The method according to claim 1, wherein determining the modification comprises selecting one or more third voltage levels to be written respectively to one or more of the analog memory cells, and wherein writing to the one or more of the analog memory cells comprises writing the one or more third voltage levels to the one or more of the analog memory cells.

3. The method according to claim 2, wherein selecting the one or more third voltage levels comprises determining a voltage correction to be applied to the first analog memory cell, and wherein writing the one or more third voltage levels comprises adding charge to the first analog memory cell so as to apply the voltage correction.

4. The method according to claim 3, wherein defining the constellation comprises defining a matrix of codewords to represent the data, each codeword corresponding to a set of the voltage levels in the constellation that are to be written to a corresponding set of the analog memory cells, and wherein determining the voltage correction comprises finding a distance between the set of the voltage levels, including the second voltage level, read from the corresponding set of the analog memory cells and one of the codewords in the matrix, and choosing the voltage correction so as to reduce the distance.

5. The method according to claim 4, wherein writing the part of the data comprises choosing a first codeword in the matrix to be written to the corresponding set of the analog memory cells, and wherein finding the distance comprises determining a first distance between the set of the voltage levels and the first codeword and a second distance between the set of the voltage levels and a second codeword in proximity to the first codeword, and wherein choosing the voltage correction comprises computing the voltage correction so as to reduce a ratio of the first distance to the second distance.

6. The method according to claim 4, and comprising, when the distance exceeds a maximal distance criterion, rewriting the part of the data to the first analog memory cell.

7. The method according to claim 2, wherein selecting the one or more third voltage levels comprises selecting a third voltage level from the constellation to be written to a second analog memory cell.

8. The method according to claim 7, wherein selecting the third voltage level comprises choosing the third voltage level responsively to both the first voltage level and the second voltage level.

9. The method according to claim 8, wherein choosing the third voltage level comprises applying feedback coding so as to write multiple successive voltage levels representing the data to a succession of the analog memory cells.

10. The method according to claim 9, wherein applying the feedback coding comprises choosing the first voltage level responsively to a probability density function (PDF), which relates the data to the voltage levels that are to be used in storing the data in the analog memory cells, and wherein choosing the third voltage level comprises updating the PDF responsively to the first and second voltage levels, and choosing the third voltage level responsively to the updated PDF.

11. The method according to claim 10, wherein the constellation comprises $2^M$ voltage levels in each of the analog memory cells, wherein M>1, and wherein choosing the third voltage level comprises partitioning the PDF into $2^M$ sub-intervals corresponding to the $2^M$ voltage levels, selecting one of the sub-intervals responsively to a value of the data, and choosing the third voltage level that corresponds to the selected one of the sub-intervals.

12. The method according to claim 7, wherein writing the part of the data comprises writing respective first voltage levels to a first group of the memory cells in a first row in the array, and wherein the second analog memory cell belongs to a second group of the memory cells in a second row of the array, to which the one or more third voltage levels are written after writing to the memory cells in the first row, and wherein each, of the memory cells is located in a respective column, and wherein selecting the third voltage level comprises determining a respective third voltage level to write to each of the memory cells in the second group responsively to the second voltage level read from one of the first group of the memory cells in the same respective column.

13. The method according to claim 7, wherein writing the part of the data comprises simultaneously writing respective first voltage levels to a first group of the memory cells in a first row in the array, and comprising choosing the first and second analog memory cells from among the memory cells in the group responsively to an ordering of the voltage levels to be written to the memory cells.

14. The method according to claim 1, wherein the constellation has a first voltage resolution, and wherein reading the second voltage level comprises determining the second voltage level with a second voltage resolution that is finer than the first voltage resolution.

15. The method according to claim 1, wherein the memory cells are selected from a set of memory cell types consisting of Flash memory cells, Dynamic Random Access Memory (DRAM) cells, Phase Change Memory (PCM) cells, Nitride Read-Only Memory (NROM) cells, and Magnetic Random Access Memory (MRAM) cells.

16. The method according to claim 1, wherein the constellation of the voltage levels comprises at least four voltage levels per cell.

17. The method according to claim 1, wherein determining the modification comprises modifying the constellation responsively to the second voltage level.

18. The method according to claim 17, wherein modifying the constellation comprises increasing at least one of the voltage levels to be used in storing the data.

19. The method according to claim 1, wherein determining the modification comprises changing a number of error correction bits that are to be added to a word of the data.

20. Apparatus for storing data, comprising:
a read/write unit, which is coupled to an array of analog memory cells so as to write a part of the data to a first analog memory cell in the array by applying to the analog memory cell a first voltage level selected from a predefined constellation of voltage levels, and which is configured to read from the first analog memory cell, after writing the part of the data thereto, a second voltage level that does not belong to the constellation; and
a signal processing unit, which is configured to determine, responsively to the second voltage level, a modification to be made in writing to one or more of the analog memory cells in the array, and to instruct the read/write unit to write to the one or more of the analog memory cells subject to the modification.

21. The apparatus according to claim 20, wherein the signal processing unit, which is configured to select, responsively to the second voltage level, one or more third voltage levels to be written respectively to the one or more of the analog memory cells, and to instruct the read/write unit to write the one or more third voltage levels to the one or more of the analog memory cells.

22. The apparatus according to claim 21, wherein the one or more third voltage levels comprise a voltage correction to be applied to the first analog memory cell, and wherein the read/write unit is configured to add charge to the first analog memory cell so as to apply the voltage correction.

23. The apparatus according to claim 22, wherein the constellation is defined by a matrix of codewords for representing the data, each codeword corresponding to a set of the voltage levels in the constellation that are to be written to a corresponding set of the analog memory cells, and wherein the signal processing unit is configured to find a distance between the set of the voltage levels, including the second voltage level, read from the corresponding set of the analog memory cells and one of the codewords in the matrix, and to choose the voltage correction so as to reduce the distance.

24. The apparatus according to claim 23, wherein the signal processing unit is configured to choose a first codeword in the matrix to be written to the corresponding set of the analog memory cells, and to determine a first distance between the set of the voltage levels and the first codeword and a second distance between the set of the voltage levels and a second codeword in proximity to the first codeword, and to compute the voltage correction so as to reduce a ratio of the first distance to the second distance.

25. The apparatus according to claim 23, wherein the signal processing unit is configured to cause the read/write unit to rewrite the part of the data to the first analog memory cell when the distance exceeds a maximal distance criterion.

26. The apparatus according to claim 21, wherein the signal processing unit is configured to select, responsively to the second voltage level, a third voltage level from the constellation to be written to a second analog memory cell in the vicinity of the first analog memory cell.

27. The apparatus according to claim 26, wherein the signal processing unit is configured to select the third voltage level responsively to both the first voltage level and the second voltage level.

28. The apparatus according to claim 27, wherein the signal processing unit is configured to apply feedback coding so as to cause the read/write unit to write multiple successive voltage levels representing the data to a succession of the analog memory cells.

29. The apparatus according to claim 28, wherein the signal processing unit is configured to choose the first voltage level responsively to a probability density function (PDF), which relates the data to the voltage levels that are to be used in storing the data in the analog memory cells, and to update the PDF responsively to the first and second voltage levels, and to choose the third voltage level responsively to the updated PDF.

30. The apparatus according to claim 29, wherein the constellation comprises $2^M$ voltage levels in each of the analog memory cells, wherein M>1, and wherein the signal processing unit is configured to partition the PDF into $2^M$ sub-intervals corresponding to the $2^M$ voltage levels, to select one of the sub-intervals responsively to a value of the data, and to choose the third voltage level that corresponds to the selected one of the sub-intervals.

31. The apparatus according to claim 26, wherein the read-write unit is configured to write respective first voltage levels to a first group of the memory cells in a first row in the array, and to write the one or more third voltage levels to a second group of the memory cells in a second row of the array after writing to the memory cells in the first row, wherein each of the memory cells is located in a respective column, and wherein the signal processing unit is configured to determine a respective third voltage level to write to each of the memory cells in the second group responsively to the second voltage level read from one of the first group of the memory cells in the same respective column.

32. The method according to claim 26, wherein the read-write unit is configured to simultaneously write respective first voltage levels to a first group of the memory cells in a first row in the array, and wherein the signal processing unit is configured to choose the first and second. analog memory cells from among the memory cells in the group responsively to an ordering of the voltage levels to be written to the memory cells.

33. The apparatus according to claim 20, wherein the constellation has a first voltage resolution, and wherein the second voltage level is determined with a second voltage resolution that is finer than the first voltage resolution.

34. The apparatus according to claim 20, wherein the memory cells are selected from a set of memory cell types consisting of Flash memory cells, Dynamic Random Access Memory (DRAM) cells, Phase Change Memory (PCM) cells, Nitride Read-Only Memory (NROM) cells, and Magnetic Random Access Memory (MRAM) cells.

35. The apparatus according to claim 20, wherein the constellation of the voltage levels comprises at least four voltage levels per cell.

36. The apparatus according to claim 20, wherein the signal processing unit is configured to modify the constellation responsively to the second voltage level.

37. The apparatus according to claim 36, wherein the signal processing unit is configured to increase at least one of the voltage levels in the constellation to be used in storing the data.

38. The apparatus according to claim 20, wherein the signal processing unit is configured to change a number of error correction bits that are to be added to a word of the data.

* * * * *